(12) United States Patent
Daniels et al.

(10) Patent No.: US 9,842,726 B2
(45) Date of Patent: Dec. 12, 2017

(54) METHOD AND APPARATUS FOR THE DETECTION OF ARC EVENTS DURING THE PLASMA PROCESSING OF A WAFER, SURFACE OF SUBSTRATE

(75) Inventors: Stephen Daniels, Dublin (IE); Shane Glynn, Tullamore (IE); Felipe Soberon, Dublin (IE); Paul Maguire, Dublin (IE)

(73) Assignee: Verity Instruments, Inc., Carrollton, TX (US)

( * ) Notice: Subject to any disclaimer, the term of this patent is extended or adjusted under 35 U.S.C. 154(b) by 1701 days.

(21) Appl. No.: 13/395,878

(22) PCT Filed: Aug. 12, 2010

(86) PCT No.: PCT/US2010/045393
§ 371 (c)(1),
(2), (4) Date: Nov. 10, 2015

(87) PCT Pub. No.: WO2011/022294
PCT Pub. Date: Feb. 24, 2011

(65) Prior Publication Data
US 2016/0268108 A1  Sep. 15, 2016

(30) Foreign Application Priority Data
Aug. 17, 2009  (IE) .................................... 2009/0628

(51) Int. Cl.
*H01J 37/32* (2006.01)
*H01L 21/3065* (2006.01)
*H01L 21/66* (2006.01)

(52) U.S. Cl.
CPC .. *H01J 37/32944* (2013.01); *H01J 37/32082* (2013.01); *H01J 37/32091* (2013.01); *H01J 37/32935* (2013.01); *H01J 37/32972* (2013.01); *H01L 21/3065* (2013.01); *H01L 22/14* (2013.01)

(58) Field of Classification Search
CPC ................................ G01N 21/00; H01J 37/32
USPC ......................................................... 356/432
See application file for complete search history.

(56) References Cited

U.S. PATENT DOCUMENTS

| | | | |
|---|---|---|---|
| 2007/0042131 A1* | 2/2007 | Soo ................... | H01J 37/32935 427/569 |
| 2011/0109530 A1* | 5/2011 | Nonomura ........ | H01J 37/32935 345/60 |
| 2014/0160634 A1* | 6/2014 | Palvadi .................. | H01H 69/00 361/600 |

* cited by examiner

*Primary Examiner* — Roy M Punnoose

(57) ABSTRACT

A method for monitoring at least one process parameter of a plasma process being performed on a semiconductor wafer, surface or surface and determine arc events occurring within the plasma tool chamber. The method comprises the steps of detecting the modulated light being generated from the plasma sheath during the plasma process; sampling RF voltage and current signals from the RF transmission line; processing the detected modulated light and the RF signals to produce at least one monitor statistic for the plasma process, and process the monitor signal to determine the occurrence of arcing events during the wafer processing.

27 Claims, 13 Drawing Sheets

METHOD AND APPARATUS FOR THE DETECTION OF ARC EVENTS DURING THE PLASMA PROCESSING OF A WAFER, SURFACE OF SUBSTRATE

FIELD OF INVENTION

The present invention relates to plasma processing. More particularly, the invention relates to a method and an apparatus for detecting arc events occurring during plasma processing of a semiconductor wafer, surface or substrate.

BACKGROUND OF THE INVENTION

Two of the main processes involved in semiconductor manufacturing are the etching of the semiconductor (ETCH) and material deposition on a substrate. Material deposition may be achieved by different methods, such as for example Physical Vapour Deposition (PVD), Chemical Vapour Deposition (CVD), Plasma Enhanced Chemical Vapour Deposition (PECVD) and Atomic Layer Deposition (ALD). Similar techniques are used in the fabrication of components such as flat panel displays and photovoltaic solar cells.

The present invention is applicable to various etch and deposition processes typically used during the manufacture of an Integrated Circuit (IC), a photonic device, or a solar cell. In particular, the invention is suitable for use in processes that involve the generation of radio frequency (RF) driven plasma discharge in the vicinity of the processing wafer or substrate, and can be implemented on ETCH, PVD, CVD and PECVD systems. The present invention is also applicable to plasma processing involved in the manufacture of Thin Film Transistor-Liquid Crystal Display (TFTLCD), Plasma Display Panel (PDP) and Organic Light Emitting Diode (OLED); also known as Light Emitting Polymer (LEP) or Organic Electro Luminescence (OEL). All of the above require plasma processing at some stage during manufacture.

There are a number of different etching tools that are in use by the semiconductor industry. Two commonly used etching tools or reactors for the etching process are the Capacitive Coupled Plasma (CCP) tool, and the Transformer Coupled Plasma (TCP) tool.

The principles of the etching process may be explained with reference to FIGS. 1 to 3. FIG. 1 shows a cross sectional view of a typical CCP processing tool. A vacuum chamber 10 incorporates a bottom electrode 2, on which the wafer or substrate 3 is placed, and a top electrode 7. Plasma bulk 5 is shown between the wafer 3 and the top electrode 7. A first plasma sheath 4 is located in the region between the plasma bulk 5 and the wafer 3. A second plasma sheath 6 may be located in a region between the plasma bulk 5 and the top electrode 7. A gas inlet 8 and an exhaust line 9 are also provided. The chamber also includes a bottom electrode radio frequency (RF) power supply 1.

FIG. 2 shows a cross sectional view of plasma chamber 10 of a typical TCP processing tool. This processing tool incorporates substantially the same components as the CCP processing tool shown in FIG. 1, but does not include a top electrode. It also includes a second radio frequency (RF) power supply 12, an antenna 13 and a dielectric window 16. It is customary to place a matching network (not shown) between the RF power supplies 1 and 12 and the powered electrode/antenna. The purpose of the network is to match the power supply impedance, which is typically 500, to the electrodes/antenna impedance. In this embodiment, a plasma sheath 4 is located in the region between wafer 3 and plasma bulk 5.

Typical operation of such tools is explained with reference to FIG. 3, in relation to a plasma chamber 10 of a CCP tool. It involves placing a wafer or substrate 3 on the bottom electrode 2, and igniting the plasma by the radio frequency power supply 1 applying a constant amount of energy to the bottom electrode 2. A controlled gas flow of a selection of feedstock gases is also provided through gas inlet 8, which is pumped at a constant throughput into the chamber 10. The transport of etch byproducts are represented by arrows 14 through the region through the plasma sheath 4 between the bottom electrode 2 and the plasma bulk 5.

The etch process results in the removal of material from the wafer 3 by sputtering, chemical etch or reactive ion etch. The removed material is then volatised into the plasma discharge. These volatile materials are called etch-by-products 4, and, together with the feedstock gases 8, contribute to the chemistry of the plasma discharge. The etch-by-products 4 and the gases 8 are pumped away through the exhaust or pumping port 9. The etch process for a TCP tool operates in a similar fashion.

The wafer is processed by a plasma multiple times during manufacture. It has been found that plasma arcs frequently occur during the processing of a wafer. These arc events occur during or immediately following the etching or deposition steps of the processing wafer; and are related to the RF design, operating parameters, wall and shield conditions, and ageing of the processing tools.

The arc events consist of transient currents flowing between the chamber walls and/or electrodes and the surface of the wafer. Arc events can also occur between other components in the processing chamber. These are also of concern, as they can lead to damage of the substrate being processed, or can lead to damage of valuable components internal to the plasma chamber. There are various consequences that may result from the occurrence of arc events. For example, they may produce particles by sputtering material off the chamber walls, which may land on the wafer surface causing defects, or they may directly damage areas of the processing wafer.

Arcs are the result of charge build-up on a surface inside the plasma processing tool. This surface could be the plasma wafer, the chamber walls or an electrode. These surfaces, which may be either conducting or insulating, are typically coated with insulating dielectric material, being products or by-products from the processing of the wafer, resulting in an insulating dielectric layer. The charge build-up' leads to a voltage difference build up across the plasma, the insulating layer and the wall surface. If the voltage level exceeds the breakdown strength of the wall or layers, it results in a stream of electrons, possibly with an avalanche effect, into the surface, to compensate for the charge difference. The electron population of the plasma is therefore depleted leaving behind a surplus of positive charge (ions). This electron density depletion occurs on a nano-second time scale (known as electron plasma frequency) while the relaxation time (i.e. the time taken for the plasma to return to steady state) is dominated by the ion mobility time scale and surface recharge speed rate, which is typically of the order of micro-seconds.

Hence, for typical plasma parameters of processing plasma discharges, an arc is a perturbation of the plasma state in a nano-second time scale followed by a plasma relaxation in the micro-second time scale. Multiple arc events may also occur. That is, one event may follow a second event and so on creating a longer perturbation overall, with a time scale of up to milli-seconds.

It will be appreciated that it would be advantageous to be able to monitor and detect arc events in real time. This would enable the processing tool to be taken out of the production line for a preventive maintenance (PM) if desired, once an arc event is detected. This is done to prevent further wafer scrap. If this could be achieved, it would result in reduced material costs, and the avoidance of further damage to the electronic devices under construction.

Research work for the purpose of studying arc events can be carried out with invasive IS techniques such as the electrostatic probe (also known as Langmuir probe) and/or by the placing of additional electrodes within the processing chamber to pick-up changes in the plasma state, such as the plasma potential or the electron density. However, this approach is not practical in a manufacturing environment.

Given the fast transient nature of plasma arcs, it will be appreciated that long time integrating sensors (in relation to the arc time 'scale), such as typical OES spectrometers and mono-chromators (which typically have a 100 ms integration time with 10 Hz data output speed) are not able to pick up plasma light variations generated by micro-arc events.

The arc event detection may be achieved by monitoring the RF power transmission lines from the RF power supply to the plasma source, for example as described in U.S. Pat. Nos. 6,332,961B1, 6,736,944B2 and US2008/019784A1. The principle behind this approach is based on the observation that the plasma impedance will change during the arc event, and that therefore the ratio of reflected to forward power, voltage and/or current of the driving frequency and/or harmonics may vary during the arc event. This impedance change however occurs fast enough for it not to be detected by the processing tool RF matching network system. Still, fast monitoring and processing of the RF voltage/current on the RF transmission line may reveal the occurrence of an arc event.

Mention to non-invasive optically based 'arc detection technique is made in US patent US2008/019784A1, while U.S. Pat. No. 6,332,961B1 discusses the possibility of observing high-severity arc events as a flash of light from the processing plasma discharge.

SUMMARY OF THE INVENTION

The present invention provides a method for detecting an arc event occurring during plasma processing of a surface being performed in a plasma chamber which is being supplied by a radio frequency power source, the method comprising the steps of:
detecting light being generated from the plasma during the process; and processing the detected light to determine when an arc event occurs.

By detecting the light from the plasma during the process, the present invention provides a technique which provides a very accurate detection of arc events, due to the fact that the light is strongly correlated with the RF current through the sheath and the wafer.

Preferably, the step of detecting light being generated from the plasma comprises detecting modulated light being emitted from the plasma sheath and the volume of plasma close to the plasma sheath.

The method may further comprise the step of:
detecting an additional process parameter of the plasma process; and
processing both the detected modulated light and the additional process parameter to determine when the arc event occurs.

Preferably, the additional process parameter comprises radio frequency signals associated with the radio frequency power source.

As an arc event can also be detected by monitoring a change in the radio frequency signals during the plasma processing, the use of the radio frequency signals as an additional process parameter provides a further means of detecting an arc event.

The step of processing the detected modulated light and the radio frequency signals may comprise the steps of:
converting the detected modulated light into a digital optical waveform and the detected radio frequency signals into a digital radio frequency waveform;
transforming the digital optical waveform and the digital radio frequency waveform from the time domain into the frequency domain;
processing the transformed optical and radio frequency waveforms to generate magnitude and relative phase data;
extracting the generated magnitude or relative phase data of one or more signals from the optical and radio frequency waveforms which correspond to those preselected to be process monitor statistics; and
detecting when the value of at least one of the one or more process monitor statistics is outside a predetermined upper and lower limit value, the detection signifying the occurrence of an arc event.

The step of processing the transformed optical and radio frequency waveforms to generate magnitude and relative phase data may comprise the steps of:
calculating for each of the optical and radio frequency waveforms the square root of the sum of the squares of the corresponding real and imaginary coefficents for each frequency of the transformed waveform to determine the magnitude data; and
calculating the difference between the phase of the transformed optical waveform and
the phase of the transformed radio frequency waveform to determine the relative phase data.

The method may further comprise the step of amplifying the detected modulated light and the radio frequency signals prior to converting the detected modulated light into a digital optical waveform and the detected radio frequency signals into a digital radio frequency waveform.

The step of transforming the optical and radio frequency waveforms from the time domain to the frequency domain may be performed by means of a numerical processing technique.

Preferably, the numerical processing technique comprises the fast fourier transform.

The method may further comprise the step of generating an indicator when the value of at least one of the one or more process monitor statistics is detected to be outside the predetermined upper and lower limit value.

The indicator may be a visual or an aural indicator or a control signal for the plasma processing to stop.

The radio frequency signals may be proportional to or representative of the current and voltage through the transmission line connecting the radio frequency power source to the plasma chamber.

The method may further comprise the step of filtering the light generated from the plasma to specific wavelengths and wherein the step of detecting comprises the step of detecting only the filtered light.

The one or more one or more preselected process monitor statistics may be determined by performing a test wafer analysis of a plurality of wafers in the plasma chamber.

The test wafer analysis may comprise the steps of: for each test wafer:

detecting light being generated from the plasma of the test wafer during a plasma process and detecting the radio frequency signals associated with the radio frequency power source of the process;

converting selected frequencies of the detected light into a digital optical waveform and selected frequencies of the detected radio frequency signals into a digital radio frequency waveform; and further comprising the steps of:

calculating an average optical waveform over time for each frequency from the plurality of optical waveforms from each test wafer and an average radio frequency waveform over time for each frequency from the plurality of digital radio frequency waveforms from each test wafer;

selecting one or more signals from among the plurality of optical and radio frequency waveforms which exhibit the largest deviation from the calculated average waveforms; and generating one or more process monitor statistics by applying a mathematical function to the selected one or more signals.

In one embodiment, the process monitor statistic is selected to be the optical magnitude of the radio frequency driving frequency.

Alternatively, the process monitor statistic may be selected to be the relative phase of the second harmonic of the radio frequency driving frequency.

The method may further comprise the step of:

calculating an average for the selected process monitor statistic; and setting for each point in time a value corresponding to 10% above the calculated average process monitor statistic as the upper limit value and setting for each point in time a value corresponding to 10% below the calculated average for process monitor statistic as the lower limit value.

Preferably, the values of the upper and the lower limits are dynamically updatable.

The one or more one or more predefined process monitor statistics may be user defined.

The present invention also provides an apparatus for detecting an arc event occurring during plasma processing of a surface being performed in a plasma chamber which is being supplied by a radio frequency power source, the apparatus comprising:

means for detecting light being generated from the plasma during the process; and means for processing the detected light to determine when an arc event occurs.

Preferably, the means for detecting light being generated from the plasma may further comprise means for detecting modulated light being emitted from the plasma sheath and the volume of plasma close to the plasma sheath.

The apparatus may further comprise:

means for detecting an additional process parameter of the plasma process; and means for processing both the detected modulated light and the additional process parameter to determine when the arc event occurs.

The additional process parameter may comprise radio frequency signals associated with the radio frequency power source.

The means for processing the detected modulated light and the radio frequency signals may further comprise:

means for converting the detected modulated light into a digital optical waveform and the detected radio frequency signals into a digital radio frequency waveform;

means for transforming the digital optical waveform and the digital radio frequency waveform from the time domain into the frequency domain;

means for processing the transformed optical and radio frequency waveforms to generate magnitude and relative phase data;

means for extracting the generated magnitude or relative phase data of one or more signals from the optical and radio frequency waveforms which have been preselected to be process monitor statistics; and means for detecting when the value of at least one of the one or more process monitor statistics is outside a predetermined range, the detection signifying the occurrence of an arc event.

The means for processing the transformed optical and radio frequency waveforms to generate magnitude and relative phase data may further comprise:

means for calculating for each of the optical and radio frequency waveform's the square foot of the sum of the squares of the corresponding real and imaginary coefficents for each frequency of the transformed waveform to determine the magnitude data; and means for calculating the difference between the phase of the transformed optical waveform and the phase of the transformed radio frequency waveform to determine the relative phase data.

The apparatus may further comprise means for amplifying the detected modulated light and the radio frequency signals prior to the means for converting the detected modulated light into a digital optical waveform and the detected radio frequency signals into a digital radio frequency waveform.

The apparatus may further comprise means for generating an indicator when the value of at least one of the one or more process monitor statistics is detected to be outside a predetermined upper and lower limit value.

The apparatus may further comprise means for filtering the light generated from the plasma to specific wavelengths and wherein the means for detecting comprises means of detecting only the filtered light.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF THE INVENTION

Figure 1:
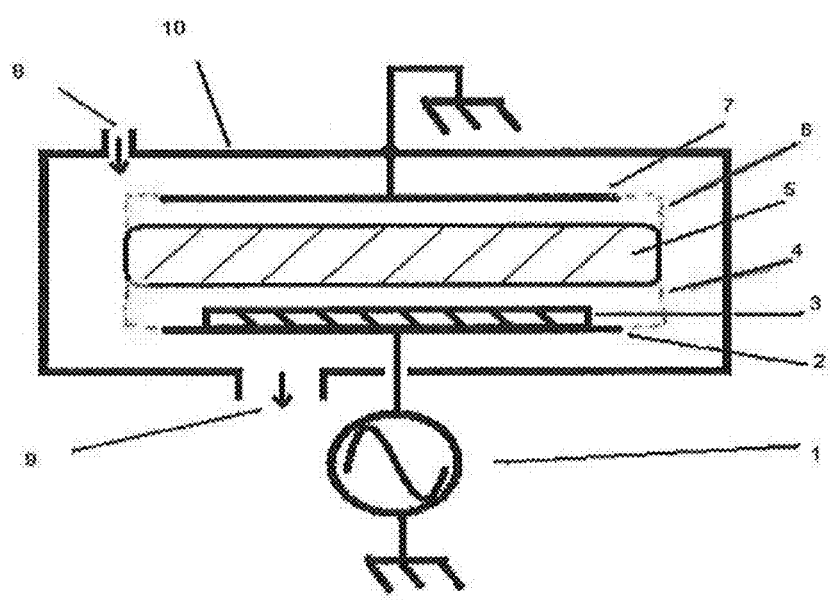
FIG. 1 is a cross sectional view of typical CCP processing tool.
Figure 2:
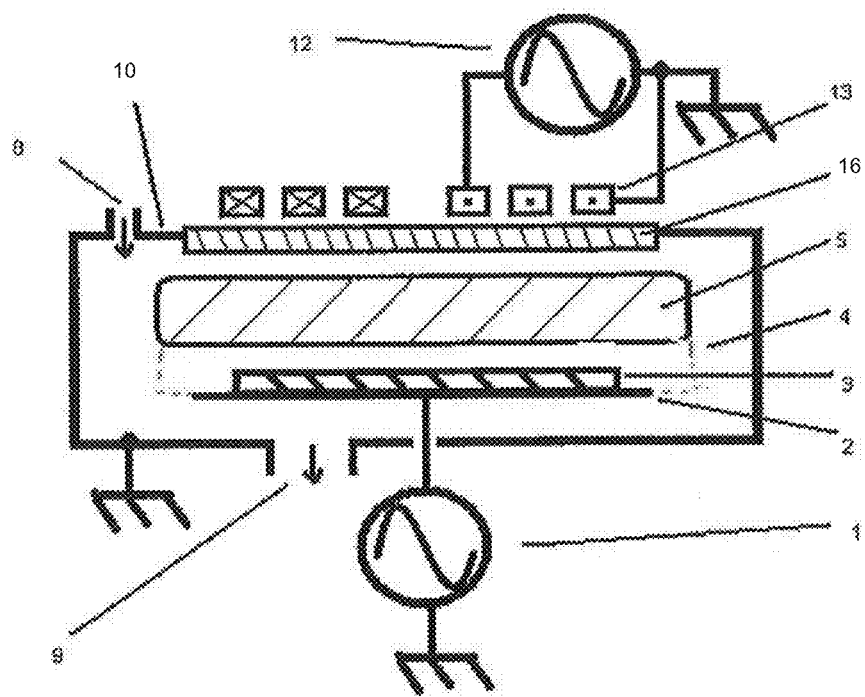
FIG. 2 is a cross sectional view of a typical TCP processing tool.
Figure 3:
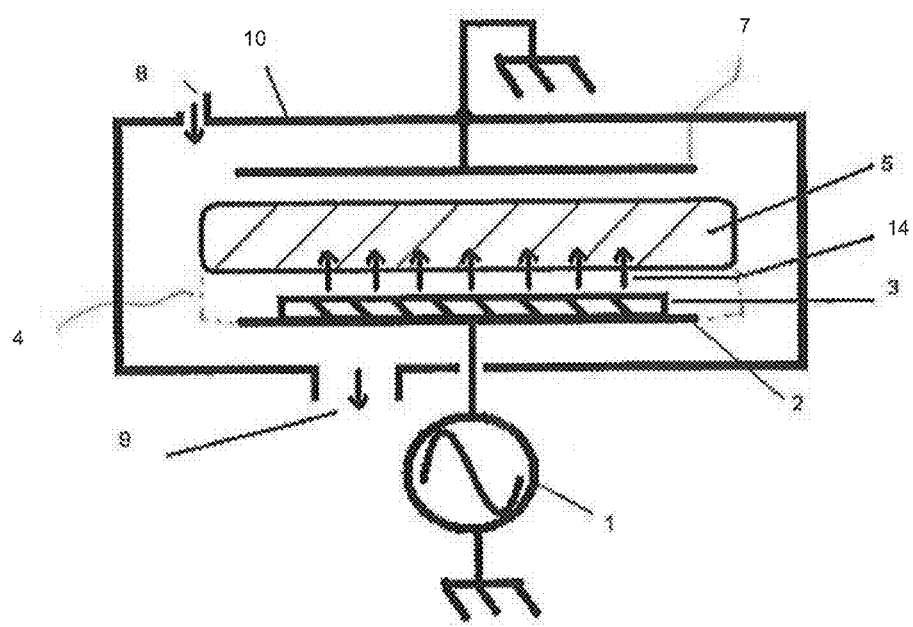
FIG. 3 is a cross sectional view of the CCP processing tool of FIG. 1 detailing the etch by-products.

In order to understand the principles behind the present invention, electron reactions that occur during the plasma processing should be appreciated. RF driven plasma discharges, as found in processing plasma tools, sustain the plasma glow by coupling RF power into a rarefied gas mixture. The large RF voltages applied cause electrons to accelerate, which is known as RF electron heating. The energetic electron population initiates an ionisation process via electron impact ionisation with the neutral atoms and/or molecules that constitute the gas mix. These excitations are directly proportional to the electron density. The plasma discharge then reaches steady state after a few RF cycles and develops the RF sheath. This sheath is a region between the RF driving electrode and the plasma bulk.

The sheath is a region of very intense varying RF electric field that is driven by the external RF power supply. The varying electric field drives a significant electron current through the sheath. The excitation of atoms and molecules is time independent in the plasma bulk, where the electron density is time uniform. On the other hand, the electron population in the sheath region is time dependent, with the electron current following the RF driving voltage. The end result is a time varying electron population that vanishes during one half of the RF cycle and builds up during the other half of the RF cycle.

Optical emission in a plasma results form optical de-excitation of excited neutrals. The time varying electron population in the sheath region forces periodic optical excitations. This is, a part of the neutral population in the sheath region are excited by electron collisions during half of the RF cycle, while there is an electron population in the sheath region, whilst no further excitations take place on the other half of the cycle when the electron population vanishes. Depending on the emission line life times of the excited states, the plasma volume in proximity to the sheath region will emit light modulated by the driving RF frequency. A caveat for this is that the optical emission line lifetime must be shorter than the RF cycle period in order to produce RF modulated light. Only a selection of wavelengths fulfilling this condition will contribute to the modulated light emission. It will be appreciated that most of the RF modulated plasma light is generated at the plasma sheath, since the electron density population variation is mainly confined to this region.

The amplitude of the modulated light is related to the tool and plasma state. This includes: gas pressure; feedstock gases; by-products; walls out-gassing; electron, density, energy and spatial distribution; ions densities energy and spatial distributions, chamber geometry; RF source type, RF driving frequency or frequencies and power level(s).

It will be appreciated that arc events can severely affect the plasma electron density across the entire plasma. The effect of the electron density variation can be observed directly through the monitoring of the modulated emission from the plasma sheath, such as the amplitude of one or more of the harmonic signals of the modulated plasma light. It can be appreciated that this is a direct measurement of the disruption of the steady state of the plasma caused by the arc event.

It will be appreciated that an arc event in proximity to a sheath will impact the sheath electrical and spatial dynamics, which will manifest as a change in the instantaneous energy of the modulated electrons, and hence the modulated light emission.

The present invention provides a method for detecting arc events during the processing of a wafer that comprises the monitoring of the RF modulated light emission from the RF plasma sheath.

In a single frequency etching tool, it is expected that the modulated light will correspond to the driving radio frequency and harmonics. In dual frequency systems, it is probable to find light modulated at the mixed up products of the two driving frequencies, as well as at the radio frequencies themselves and their harmonics.

By monitoring the modulated light, the present invention provides a technique which is more sensitive to the occurrence of micro-arc events, due to the fact that the modulated light is strongly correlated with the RF current through the sheath and the wafer. Any perturbation of this current by an arc event can be clearly detected by monitoring the modulated light from the plasma.

An arc event can also be detected by monitoring the plasma impedance change during the arc event. This is observed as a change in the electrical parameters through the transmission line such as the current, voltage and power. Typical RF plasma tools include a matching network between the RF power supply and the plasma chamber in order to maximise the output power delivered to the plasma discharge. The RF voltage and current through the transmission line can then be measured by placing an electrical RF pick up in the line either before or after the matching network.

The monitoring parameters for the present invention may accordingly comprise not only of the amplitude of modulated light driving and/or harmonic frequency, but also optionally in addition one or more of the following process parameters: the phase of the modulated light driving and/or harmonic frequency with respect to the corresponding signal and/or harmonic on the RF line, and the voltage and/or the current amplitude for the driving and/or harmonic frequency from the RF transmission line.

The detecting is performed by a combination of sensors which are sensitive to the time dependent radiation emitted from the plasma during the wafer processing and the RF voltage and current that sustain and drive the plasma discharge. A sensor such as a photo-multiplier or a photo-diode can convert the modulated light emission to an analogue signal and further digitise it for analysis. It will be appreciated that such a waveform will be rich in harmonics, as the electron population variation in the sheath is non-sinusoidal due to the diode-like characteristic of the plasma sheath.

Before an arcing event occurs, the plasma state may change momentarily. This instability may be observed in the modulated optical emission measured by a sensor and may be used as a predictor for an arcing event. In this case, the user may want to take some evasive action to prevent the arcing occurring in order to protect the integrity of the product being processed or the processing equipment. For example, in a closed loop control scheme on a processing tool, the operating regime of the plasma might be changed by adjusting pressure or power, etc.

The data collected by the sensors is then used to generate one or more statistics for the monitoring of the wafer being processed, which are then used to determine the occurrence of arc events during the processing of the wafer. By the term statistic we mean a signal resulting from a mathematical combination of one or more raw signals. In one embodiment of the present invention, the processing of these raw data signals comprises the use of a Fast Fourier Transform (FFT) algorithm. However, it will be appreciated that the processing can be carried out by any suitable means, and should not be thought of as being limited only to this numerical method.

The arc events can be detected by setting upper and lower limits to the monitored parameters during the wafer processing. If a monitor signal exceeds or falls below the set limits, an alarm may be activated to indicate a significant signal deviation. It should also be appreciated that monitor signals may show a fast initial variation, on the nano-second time scale for arc events. The rate at which the parameter signals change can be also monitored by taking the derivative of the same in real time. A steep change together with a deviation beyond pre-set limits is likely to indicate the occurrence of an arc event.

One embodiment of the present invention comprises the use of a modulated plasma light detection sensor only to generate one or more monitor statistics that are used to determine the occurrence of arc events during the processing of the wafer. This is a purely non-invasive embodiment.

The present invention may alternatively comprise detecting the arc event by the use of a modulated plasma light detection sensor in conjunction with a sensor that detects another process parameter. In one embodiment, this is performed by the use of a RF voltage and current sensor and a modulated plasma light detection sensor to generate one or more monitor statistics to determine the occurrence of arc events during the processing of the wafer. This embodiment requires some degree of invasion of the RF transmission line between the RF supply, the matching network and the processing tool chamber in order to sample the RF voltage and current signals.

While the detailed description of the invention is based on the second embodiment described above, it should be noted that this is done for illustration purposes and it is not intended to limit the scope of the present disclosure to this embodiment only.

Figure 4:
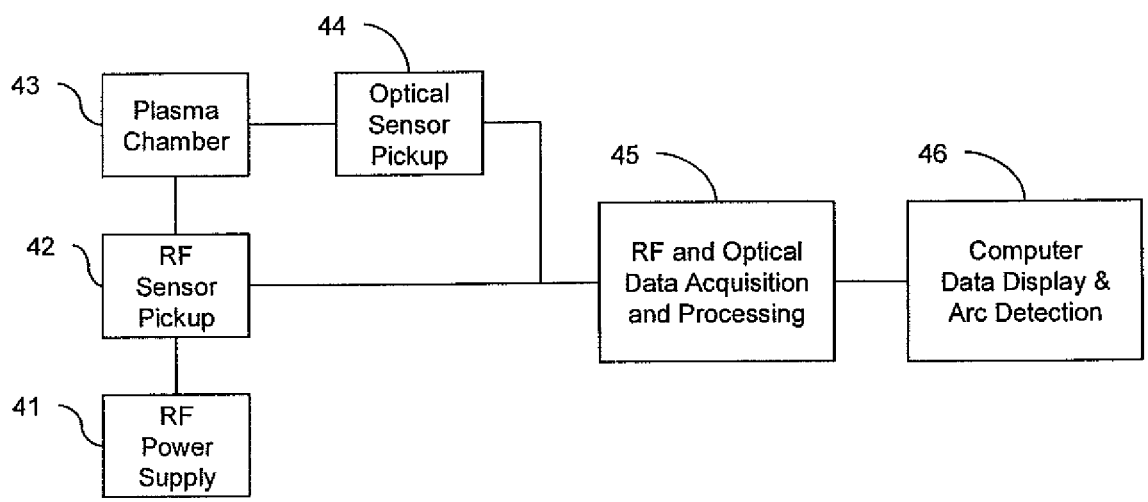
FIG. 4 is the arc detection embodiment main diagram.

FIG. 4 shows a block diagram of one embodiment of the components of the present invention. A RF power source 41 is connected to the plasma chamber of a processing tool via a transmission line. A RF sampling sensor pickup 42 is placed in the RF transmission line between the plasma chamber 43 and the RF power supply 41 to detect the RF signals in the transmission line. In this embodiment, the transmission line is a co-axial cable (comprising a centre conductor surrounded by a dielectric material and an electric shield), while the RF sampling sensor pickup 42 is a metal component having RF connectors for connection between the RF power supply 41 and the plasma chamber. An optical sensor pickup 44 is attached to the plasma chamber to detect the optical emissions from the plasma. This includes the detection of modulated light being emitted from the plasma sheath and the volume of plasma close to the plasma sheath.

The outputs of the optical sensor pickup 44 and RF sensor pickup 42 are then attached to a data acquisition and processing unit 45. In the described embodiment, the optical sensor is attached to the data acquisition and processing unit through the use of conductors linking the sensor to the processing unit 45, while the RF sensor pickup 42 is attached via shielded cables to the unit. The data acquisition and processing unit 45 is also attached to a personal computer 46.

Figure 5:
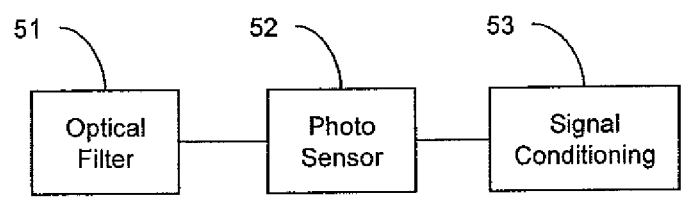
FIG. 5 is the optical sensor pickup diagram.

FIG. 5 shows further details of the optical sensor pickup 44. By the term an optical sensor "pickup", we mean a sensor that is sensitive to optical input and that will produce an electrical output signal proportional or representative of the optical input. It comprises two components, namely a photo-sensor 52 and an optical filter 51, which is located between the plasma and the photo-sensor 52. The optical filter 51 has the effect of narrowing the input light to the sensor to bands a few nanometres wide centred at specific wavelengths. This enables light to be selected from certain species in the plasma, and therefore of removing unwanted wavelength bands.

The sensor 52 can take any suitable form, such as for example a photo-diode or a photo-multiplier tube. However, in order to successfully detect the plasma light modulation, the sensor 52 should have a fast response time. The photo-sensor 52 converts the optical signal it receives to an electrical signal.

It will be appreciated that one or more optical sensor pickups fitted with variety of optical filters may be used, each filter adapted to detect a particular optical wavelength band. Multiple optical channels may also be used to detect arc events related to different components in the processing chamber, by directing the view of the optical channel to the various component(s) of interest.

In one embodiment of the invention, the RF sensor pickup 42 forms a modified section of the main RF transmission line and includes a small loop antenna and a small electrode near its centre conductor. This design ensures that the antenna and electrode cause minimal perturbation to the transmission line. A voltage signal is induced in the antenna by the current flowing through the centre conductor, and, a voltage signal is then coupled to the electrode from the voltage on the centre conductor. The resulting electrical signals are proportional or representative of the current and voltage through the centre conductor of the main transmission line.

The electrical signals coming from the outputs of both the optical and the RF sensor pickups are then input to a signal conditioning device 53 for amplification prior to being passed to the data acquisition and processing block. In one embodiment of the invention, the conditioning is carried out by a trans-impedance amplifier (TIA) and a programmable variable gain voltage amplifier (VGA). The trans-impedance amplifier converts the signals from the sensors to voltage signals, while the voltage amplifier amplifies these voltage signals.

Figure 6:
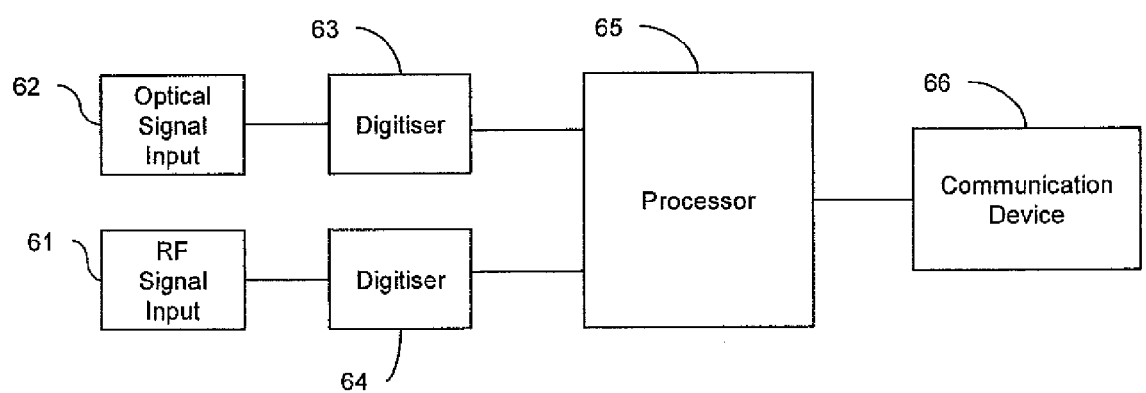
FIG. 6 is the data acquisition and processing diagram.

FIG. 6 shows the main components of the RF and optical data acquisition and processing block 45 of FIG. 4. A plurality of digitiser units, 63 and 64 are adapted to receive conditioned RF 61 and optical 62 signals. In one embodiment of the invention, the digitisation is carried out by an analogue to digital converter (ADC), with the optical and RF waveforms are digitised simultaneously by separate ADCs. In a preferred embodiment of the invention, the ADC operates at frequencies up to 30 MHz. A processor 65 provides for the processing of the digital signals into the format required in order to enable the arc events to be detected by the personal computer 46, as is explained in further detail below. The processor 65 may be any suitable processing device, such as an Application Specific Integrated Circuit (ASIC) microcontroller or a Field Programmable Gate Array (FPGA).

The computer 46 provides for the further processing of the processor output signal to detect the arc events and generate one or more indicators when this occurs. A communication device 66 provides the link between the processing unit 65 and the personal computer 46. In the preferred embodiment, this device is a USB module, which includes a micro-controller, which handles the communication between the computer and the processor. However, the communication device can be any suitable device, such as for example a serial or Ethernet module.

It will be appreciated that while the RF and optical data acquisition and processing block 45 and the computer 46 have been described as separate components, these components could equally well be provided as an integrated processing system.

Figure 7:
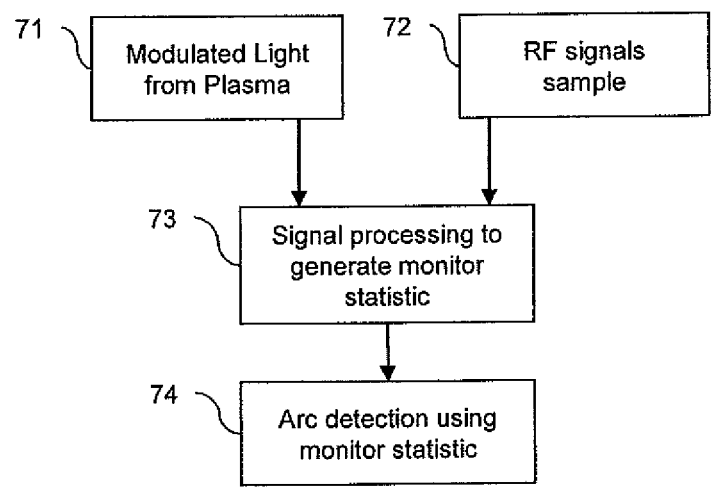
FIG. 7 is the arc detection embodiment main flow chart.

FIG. 7 details the process flow of the main steps of one embodiment of the present invention. In step 71, plasma modulated light and RF signals are captured during the plasma processing of a wafer by the respective optical and RF sensors. The captured signals are then sampled (step 72). These two steps are achieved by the optical sensor pickup 44 continuously detecting the modulated light emitted from the plasma sheath, while the RF sensor pickup 42 continuously samples the voltage and current signals through the transmission line between the RF power supply and the plasma chamber. The plasma light may be additionally filtered to only detect light of particular optical wavelength bands by the use of one or more optical filters. In step 73, the detected modulated plasma light and RF signals are processed in real time by the processor 45, and then input to the personal computer 46 to generate one or more monitor statistics, for the ongoing plasma process. The resulting statistics are further processed by an arc detection algorithm in the personal computer 46, to determine whether one or more arc events have occurred during the plasma processing of the wafer (step 74). An indicator is then generated when the algorithm returns a positive arc detection output.

Figure 8:
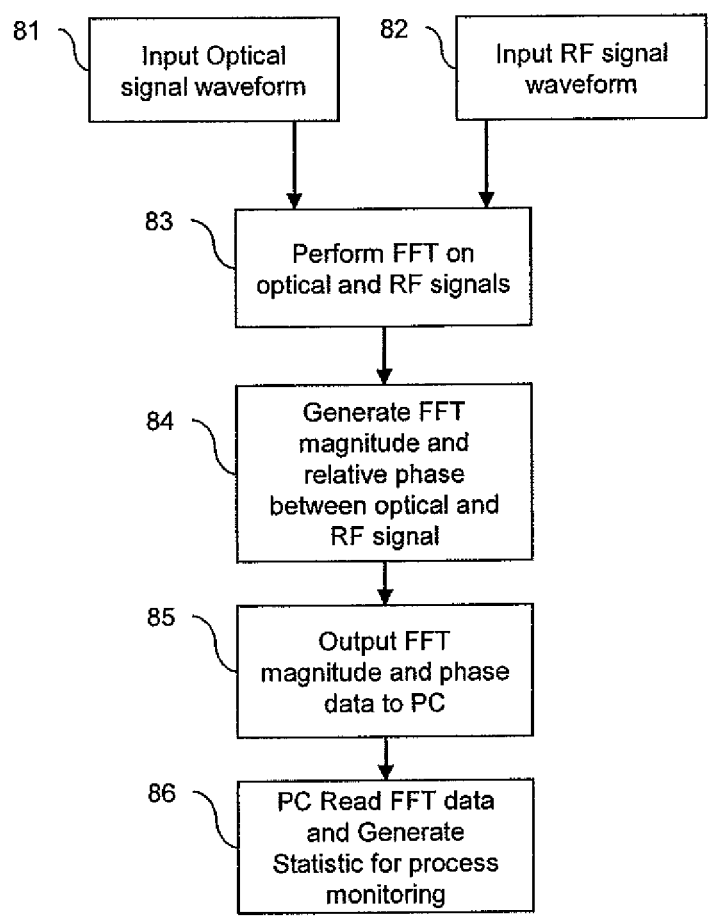
FIG. 8 is the data processing flow chart.

FIG. 8 shows further details of the process flow for the signal processing and statistic generation steps of the invention. Once the digitised optical and RF waveform signals are input to the processing unit (steps 81 and 82), the processor 6 then performs a Fast Fourier Transform (FFT) on both the optical and the RF waveforms (step 83). The FFT transforms the digital signals into the frequency domain. By performing a FFT, the frequency components of a given waveform can be identified, by decomposing the frequency content and presenting it in an intensity frequency data format. The resulting real and imaginary components of each FFT are then further processed to generate a magnitude FFT for each waveform and a relative phase between the optical waveform and the electrical waveform FFT (step 84).

The relative phase FFT is calculated as the difference between the phase FFT of the optical and the RF signal waveforms. The phase of each waveform is relative to the phase of the sampling digitiser. It will be appreciated that the reference phase is the same for each waveform, due to the fact that the respective optical and RF signal ADCs are clocked simultaneously. Therefore, a simple difference between FFT phases is enough to calculate the relative phase FFT.

Figure 9:
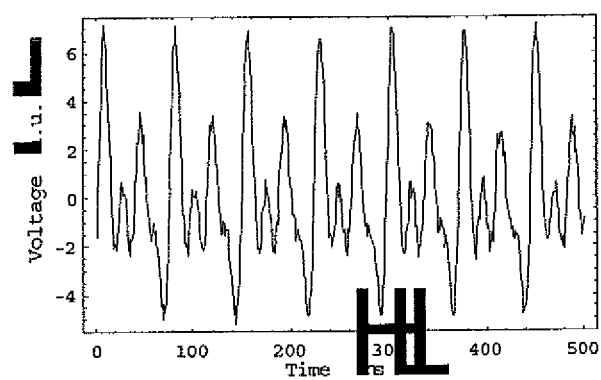
FIG. 9 is a plot of sample waveform.
Figure 10:
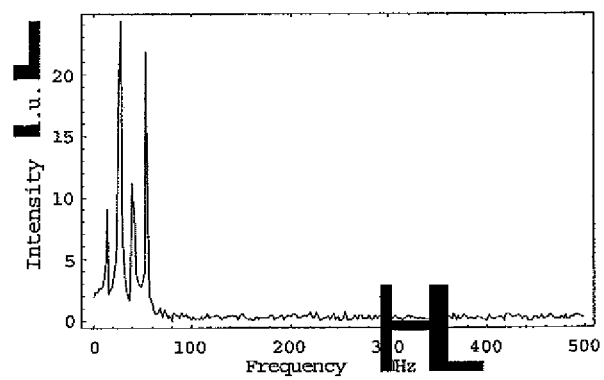
FIG. 10 is a plot the FFT magnitude of sample waveform on FIG. 9.

The magnitude FFT for each waveform is calculated by taking the square root of the sum of the squares of the corresponding real and imaginary parts for each frequency of the FFT. FIG. 9 shows a sample RF waveform in the time domain. The corresponding magnitude FFT for this sample RF waveform is then shown in FIG. 10.

The resulting calculated FFT magnitudes and phases are then output from the processor to the personal computer (step 85). In step 86, the PC reads the FFT and further processes them to generate one or more statistics for the monitoring of the plasma processing of a wafer and the detection of arc events. This is achieved by the computer extracting from the received FFT signals one or more signals which have been preselected to use as process monitor statistics. In general, those signals that are determined to provide the most accurate assessment of the process state, namely the stability of the processing plasma and when an arc event has occurred, are selected as the process monitor statistics. The selection of the process monitor statistics is carried out after a series of production wafers data has been captured and analysed, details of which are described later.

The process monitor statistics can be a combination of any number of the output values of the FFT. Various statistical processing techniques may be used here, in particular Multi-Variate Analysis (MVA), such as Principal Component Analysis (PCA). In one embodiment of the invention, the optical FFT magnitude of the RF driving frequency is used as the monitor statistic. An alternative embodiment of the invention uses the relative phase value of the second harmonic of the RF driving frequency as the monitor signal.

Figure 11:
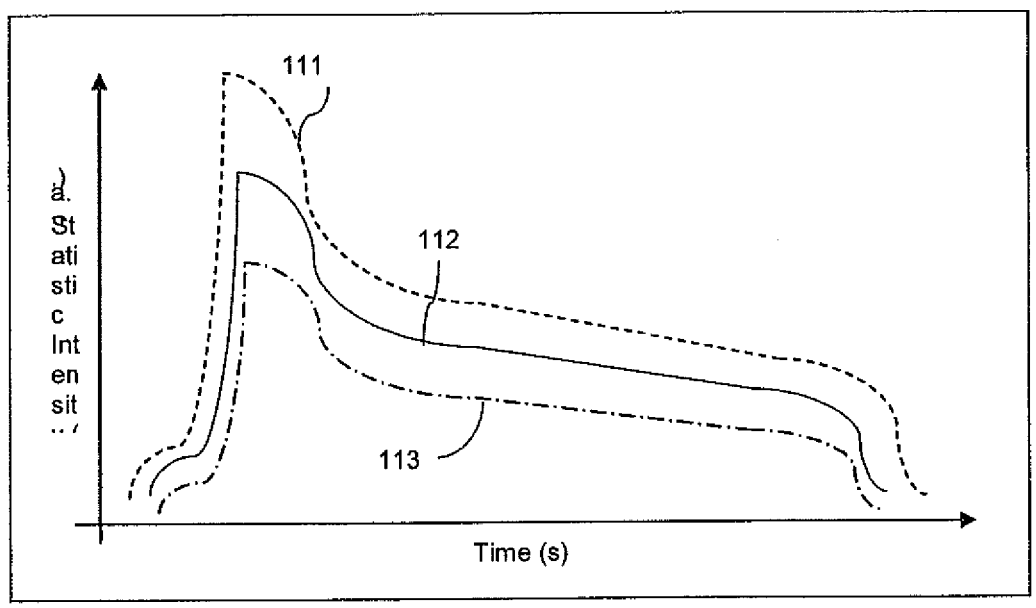
FIG. 11 is a plot of a process monitor statistic and process monitor limits.

In the described embodiment of the invention, in order to determine whether an arc event has occurred, upper and lower limits must first be set for the one or more process monitor statistics, as is illustrated in FIG. 11. In this embodiment, the upper 111 and lower 113 limits may be set to +/− 10% of the typical statistic time signal. An arc event is then deemed to be detected if the monitor statistic 112 varies beyond these pre-defined limits. In the case where more than one monitor statistic is being used, they can be viewed as a set of bells, where, if at least one of them "rings" to indicate that the statistic has gone off limits, then an arc event is deemed to have occurred.

It will be appreciated that the upper and lower limits may be dynamically updated wafer to wafer and lot to lot based on the monitor statistics from wafers for which no arc events have been detected. In this way, the arc detection algorithm may compensate for tool drift and ageing in between tool preventive maintenance (PM) services.

Figure 12:
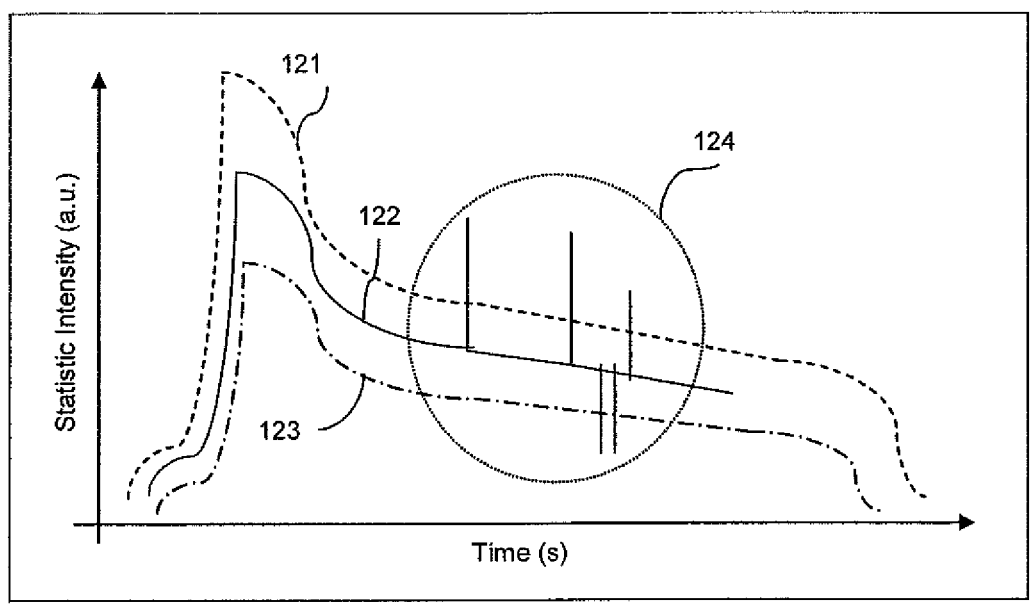
FIG. 12 is a plot of a process monitor statistic and process monitor limits detailing arc events.

FIG. 12 further illustrates the arc detection process once the upper and lower limits of a process monitor statistic have been set. The monitor statistic 122 is plotted together with its determined upper and lower limits 121 and 123. In this example, it can be seen that the monitor statistic presents fast signal deviations from the normal state of operation 124. These fast deviations or transients are identified with arcing events. When it is determined that the monitor statistic has varied beyond these limits, an indicator is activated.

Any suitable means of indicating can be used. In one embodiment of the invention, the indicator generated by the computer is a visual or aural indicator. In another embodiment of the invention, the indicator is a control signal for the plasma processing tool to stop the process. The process could also be set to continue, with the arc detection algorithm instead programmed to log the number of times an arc event is detected.

It will be appreciated that the processor could also perform a number of alternative tasks if an arc event is detected, depending on end user requirements for the detection of arc events during the processing of the wafer.

Other numerical processing techniques could equally well be used instead of Fourier analysis (FFT) for the arc detection embodiment.

To determine the most suitable process monitor statistics to use for arc detection, a number of wafers in a given number of lots are tested in a plasma processing tool using the same optical and RF sensors that will be used when the actual arc detection is being performed for a particular wafer, and the data collected recorded. It is desirable to process a large number of wafers. The purpose is twofold; first to create a data set record to determine the repeatability of the process and process drift, and second to increase the chances of capturing one or more arc events, and any specific signature they may exhibit. A large data set record of stable process statistics is therefore required to build an arc event free sample of the monitor statistic, so that the real time monitor statistics can be compared with the sample set to determine process drift and arc events.

The process drift may comprise an overall change in signal intensity and/or shape. This is a typical plasma process behaviour due to the ageing of the plasma chamber through the preventive maintenance (PM) cycle—that is through continuous use of the tool—for example the fact that material deposition which builds up on the chamber walls and view-ports affects the plasma chamber impedance (optical and RF signal affects) and view-port clouding (optical intensity affects).

Figure 13:
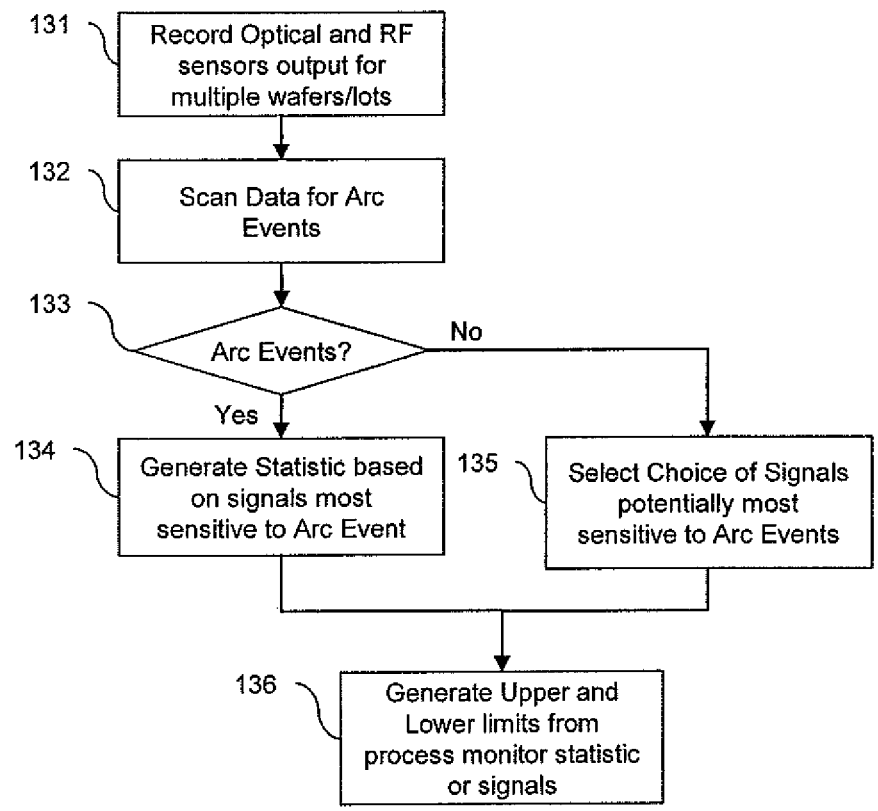
FIG. 13 is a flow chart detailing the generation of monitor statistic and limits.

FIG. 13 illustrates the typical steps involved in the determination of the process monitor statistics, and the upper and lower limits of the statistics. In step 131, the optical and RF sensors detect RF and optical signals in the same manner as described previously. Those signal intensities which correspond to the driving frequency and/or the harmonics of the processing tool are then converted from the time domain into the frequency domain by means of a Fast Fourier Transform. This is performed until data for multiple wafers and lots has been recorded (step 131). In step 132, a determination is made as to whether any arc events have been captured in the data record for the selected frequencies. In one embodiment of the invention, this is achieved by the data from the driving frequency time signal from the optical sensor being plotted and compared across all the captured wafers. An average time signal waveform or curve is then calculated for all of those driving frequency time signal waveforms which do not appear to have experienced an arc event, and each individual waveform is compared to the average. Any fast deviation observed on a particular signal from the average waveform can be flagged as an arc event. Furthermore, the arc event or events can be confirmed by performing a wafer surface scan for defects. If the flagged wafer returns a number of defects above normal, the correlation between the recorded data and the wafer surface state is confirmed.

If arc events have been captured during the data record (step 133), the next step is to determine from those waveforms which have exhibited an arc event the best combination to use to generate a robust statistic to monitor the plasma process (step 134).

In one embodiment of the invention it may be found that, for the process monitored, the optical signal for the driving frequency and its second harmonic show opposite signal changes, one positive while the second negative, to the occurrence of an arc event. Therefore, a mathematical function can be applied to these signals, the result of which is the process monitor statistic. In this case, the difference of these two signals constitutes a good combination resulting in a more sensitive statistic to the arc events than either signal individually. However, any other suitable choice of statistic generation by a linear or non-linear combination of any number of output signals by the optical and RF sensor could equally well be used.

If no arc event is captured during the data record, then a choice as to the most suitable process monitor statistic must be made based on the end user's best judgement and experience (step 135). The choice of signals to use should be based on those that are assessed to have the highest probability of being sensitive to the occurrence of arc events. Upon further process monitoring, the occurrence of arc events is likely. The monitoring statistic may also be updated as discussed earlier, to improve the arc detection algorithm.

Step 136 consists on determining the upper and lower limits for the one or more process monitor statistics. A sample process monitor statistic is determined by the processing data recorded. In one embodiment of the invention, the sample, being average of the process monitor statistic, is calculated from data corresponding to the last captured wafer lot. In this case, the monitor statistic can be updated dynamically, by averaging the statistic over the last wafer lot. The upper and lower limits of the monitor statistic can then be set to a range value above and below the statistic average waveform curve as a function of time. FIG. 11 illustrates this choice of limits. It can be seen that if 112 is taken as the lot average monitor statistic curve, then the upper and lower limit curves, 111 and 113, are set to values greater and smaller than the statistic curve at each point in time by a given percentage of the statistic value at the corresponding time.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal that may be transmitted via an electrical or an optical cable or by radio or other means.

The invention is not limited to the embodiments herein before described but may be varied in both construction and detail. The words "comprises/comprising" and the words "having/including" when used herein with reference to the present invention are used to specify the presence of stated features, integers, steps or components but does not preclude the presence or addition of one or more other features, integers, steps, components or groups thereof.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

What is claimed is:

1. A method for detecting an arc event occurring during plasma processing of a surface being performed in a plasma chamber which is being supplied by a radio frequency power source, the method comprising the steps of:
   detecting light being generated from the plasma during the processing, wherein the detecting light includes detecting modulated light being emitted from a plasma sheath and the volume of plasma close to the plasma sheath; and
   processing the detected light to determine when an arc event occurs.

2. The method of claim 1 further comprising the step of:
   detecting an additional process parameter of the plasma process; and
   processing both the detected modulated light and the additional process parameter to determine when the arc event occurs.

3. The method of claim 2, wherein the additional process parameter comprises radio frequency signals associated with the radio frequency power source.

4. The method of claim 3, wherein the radio frequency signals are proportional to or representative of the current and voltage through the transmission line connecting the radio frequency power source to the plasma chamber.

5. The method of claim 3, wherein the step of processing the detected modulated light and the radio frequency signals comprises the steps of:
converting the detected modulated light into a digital optical waveform and the detected radio frequency signals into a digital radio frequency waveform;
transforming the digital optical waveform and the digital radio frequency waveform from the time domain into the frequency domain;
processing the transformed optical and radio frequency waveforms to generate magnitude and relative phase data;
extracting the generated magnitude or relative phase data of one or more signals from the optical and radio frequency waveforms which correspond to those preselected to be process monitor statistics; and
detecting when the value of at least one of the one or more process monitor statistics is outside a predetermined upper and lower limit value, the detection signifying the occurrence of an arc event.

6. The method of claim 5, wherein the step of processing the transformed optical and radio frequency waveforms to generate magnitude and relative phase data comprises the steps of:
calculating for each of the optical and radio frequency waveforms the square root of the sum of the squares of the corresponding real and imaginary coefficients for each frequency of the transformed waveform to determine the magnitude data; and
calculating the difference between the phase of the transformed optical waveform and the phase of the transformed radio frequency waveform to determine the relative phase data.

7. The method of claim 5, further comprising the step of amplifying the detected modulated light and the radio frequency signals prior to converting the detected modulated light into a digital optical waveform and the detected radio frequency signals into a digital radio frequency waveform.

8. The method of claim 5, wherein the step of transforming the optical and radio frequency waveforms from the time domain to the frequency domain is performed by means of a numerical processing technique.

9. The method of claim 8, wherein the numerical processing technique comprises the fast fourier transform.

10. The method of claim 5, further comprising the step of generating an indicator when the value of at least one of the one or more process monitor statistics is detected to be outside the predetermined upper and lower limit value.

11. The method of claim 10, wherein the indicator is a visual or an aural indicator or a control signal for the plasma processing to stop.

12. The method of claim 5, wherein the one or more preselected process monitor statistics are determined by performing a test wafer analysis of a plurality of wafers in the plasma chamber.

13. The method of claim 12, wherein the test wafer analysis comprises the steps of:
for each test wafer:
detecting light being generated from the plasma of the test wafer during a plasma process and detecting the radio frequency signals associated with the radio frequency power source of the process;
converting selected frequencies of the detected light into a digital optical waveform and selected frequencies of the detected radio frequency signals into a digital radio frequency waveform;
and further comprising the steps of:
calculating an average optical waveform over time for each frequency from the plurality of optical waveforms from each test wafer and an average radio frequency waveform over time for each frequency from the plurality of digital radio frequency waveforms from each test wafer;
selecting one or more signals from among the plurality of optical and radio frequency waveforms which exhibit the largest deviation from the calculated average waveforms; and
generating one or more process monitor statistics by applying a mathematical function to the selected one or more signals.

14. The method of claim 13 wherein the process monitor statistic is selected to be the optical magnitude of the radio frequency driving frequency.

15. The method of claim 13 wherein the process monitor statistic is selected to be the relative phase of the second harmonic of the radio frequency driving frequency.

16. The method of claim 13 further comprising the step of:
calculating an average for the selected process monitor statistic; and
setting for each point in time a value corresponding to 10% above the calculated average process monitor statistic as the upper limit value and setting for each point in time a value corresponding to 10% below the calculated average for process monitor statistic as the lower limit value.

17. The method of claim 16 wherein the values of the upper and the lower limits are dynamically updatable.

18. The method of claim 13 where the one or more predefined process monitor statistics are user defined.

19. The method of any of claim 1, further comprising the step of filtering the light generated from the plasma to specific wavelengths and wherein the step of detecting comprises the step of detecting only the filtered light.

20. An apparatus for detecting an arc event occurring during plasma processing of a surface being performed in a plasma chamber which is being supplied by a radio frequency power source, the apparatus comprising:
means for detecting light being generated from the plasma during the processing, wherein the means for detecting light is configured to detect modulated light being emitted from a plasma sheath and the volume of plasma close to the plasma sheath; and
means for processing the detected light to determine when an arc event occurs.

21. The apparatus of any of claim 20, further comprising means for filtering the light generated from the plasma to specific wavelengths and wherein the means for detecting comprises means of detecting only the filtered light.

22. The apparatus of claim 20 further comprising:
means for detecting an additional process parameter of the plasma process; and
means for processing both the detected modulated light and the additional process parameter to determine when the arc event occurs.

23. The apparatus of claim 22, wherein the additional process parameter comprises radio frequency signals associated with the radio frequency power source.

24. The apparatus of claim 23, wherein the means for processing the detected modulated light and the radio frequency signals further comprises:
- means for converting the detected modulated light into a digital optical waveform and the detected radio frequency signals into a digital radio frequency waveform;
- means for transforming the digital optical waveform and the digital radio frequency waveform from the time domain into the frequency domain;
- means for processing the transformed optical and radio frequency waveforms to generate magnitude and relative phase data;
- means for extracting the generated magnitude or relative phase data of one or more signals from the optical and radio frequency waveforms which have been preselected to be process monitor statistics; and
- means for detecting when the value of at least one of the one or more process monitor statistics is outside a predetermined range, the detection signifying the occurrence of an arc event.

25. The apparatus of claim 24, wherein the means for processing the transformed optical and radio frequency waveforms to generate magnitude and relative phase data further comprises:
- means for calculating for each of the optical and radio frequency waveforms the square root of the sum of the squares of the corresponding real and imaginary coefficents for each frequency of the transformed waveform to determine the magnitude data; and
- means for calculating the difference between the phase of the transformed optical waveform and the phase of the transformed radio frequency waveform to determine the relative phase data.

26. The apparatus of claim 24, further comprising means for amplifying the detected modulated light and the radio frequency signals prior to the means for converting the detected modulated light into a digital optical waveform and the detected radio frequency signals into a digital radio frequency waveform.

27. The apparatus of claim 24, further comprising means for generating an indicator when the value of at least one of the one or more process monitor statistics is detected to be outside a predetermined upper and lower limit value.

* * * * *